(12) United States Patent
Chiu

(10) Patent No.: US 12,211,576 B2
(45) Date of Patent: Jan. 28, 2025

(54) DETERMINATION CIRCUIT AND MEMORY DEVICE AND PERIPHERAL CIRCUIT THEREOF

(71) Applicant: Winbond Electronics Corp., Taichung (TW)

(72) Inventor: Liang-Hsiang Chiu, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 142 days.

(21) Appl. No.: 18/295,013

(22) Filed: Apr. 3, 2023

(65) Prior Publication Data

US 2023/0335214 A1 Oct. 19, 2023

(30) Foreign Application Priority Data

Apr. 18, 2022 (TW) ................... 111114641

(51) Int. Cl.
*G11C 5/14* (2006.01)
*G11C 7/10* (2006.01)
*G11C 29/52* (2006.01)

(52) U.S. Cl.
CPC ................ *G11C 29/52* (2013.01); *G11C 5/14* (2013.01); *G11C 7/1039* (2013.01)

(58) Field of Classification Search
CPC ......... G11C 29/52; G11C 5/14; G11C 7/1039; G11C 7/1057; G11C 7/1084; G11C 29/42; G11C 29/022; G11C 2029/0411
See application file for complete search history.

(56) References Cited

U.S. PATENT DOCUMENTS

| | | | |
|---|---|---|---|
| 9,786,345 B1 * | 10/2017 | Thiruvengadam | G11C 11/2255 |
| 9,947,410 B2 | 4/2018 | Yamauchi et al. | |
| 10,453,532 B1 | 10/2019 | Antonyan | |
| 11,081,157 B2 * | 8/2021 | Vimercati | G11C 7/02 |
| 2013/0088919 A1 | 4/2013 | Kim | |
| 2020/0105345 A1 | 4/2020 | Baek et al. | |
| 2020/0185019 A1 | 6/2020 | Vimercati | |

FOREIGN PATENT DOCUMENTS

| TW | I653633 B | 3/2019 |
|---|---|---|
| WO | WO 2012/006160 A1 | 1/2012 |

* cited by examiner

*Primary Examiner* — Xiaochun L Chen
(74) *Attorney, Agent, or Firm* — Birch, Stewart, Kolasch & Birch, LLP

(57) ABSTRACT

A peripheral circuit of a memory device includes a compensation circuit, a determination circuit, and a plurality of page buffers. The compensation circuit defines a leakage current. The determination circuit is coupled to the compensation circuit, and is operated according to the leakage current. The determination circuit includes a current source, a first current mirror, a second current mirror, a potentially-qualified-bit quantity control unit, a determination circuit enable control unit, a hysteresis circuit, and a first logic unit. The page buffers include an unselected page buffer and a selected page buffer. The unselected page buffer is coupled to the compensation circuit. The selected page buffer is coupled to the determination circuit.

20 Claims, 5 Drawing Sheets

DETERMINATION CIRCUIT AND MEMORY DEVICE AND PERIPHERAL CIRCUIT THEREOF

CROSS REFERENCE TO RELATED APPLICATIONS

This application claims priority of Taiwan Patent Application No. 111114641 filed on Apr. 18, 2022, the entirety of which is incorporated by reference herein.

BACKGROUND OF THE INVENTION

Field of the Invention

The disclosure generally relates to a memory device, and more specifically, to a memory device using an ECC (Error Checking and Correction) circuit and its determination circuit and peripheral circuit.

Description of the Related Art

In a flash memory, if data programming or erasure is repeatedly performed, it is easy to cause degradation of the charge retention characteristics due to deterioration of the tunnel insulating film, or to cause threshold voltage variation due to the charge captured by the tunnel insulation film, resulting in bit errors. In order to solve the problem of bit errors, a conventional flash memory is usually equipped with an ECC (Error Checking and Correction) circuit. By configuring the ECC circuit, even if there are some fail bits which do not pass the verification, they can be repaired by the ECC, and the operation (such as programming) of the selected range (such as page) can be judged as potentially qualified. In a conventional flash memory with an ECC circuit, a determination circuit is an indispensable design. By using the determination circuit, it is possible to judge whether the potentially qualified bits are qualified, or whether all the bits are qualified, thereby reducing programming failures and bad blocks, improving the yield, suppressing programming interference by reducing the number of programming pulses applied. However, with the gradual miniaturization and high-temperature process utilization of semiconductor processes, conventional determination circuits often encounter problems such as high power consumption, large leakage current when the page buffer is turned off, resistance mismatch, insufficient determination margins, comparator errors, etc. To solve these problems, a conventional flash memory equipped with an ECC circuit requires additional circuits, which increase the chip area and make pre-shipment testing more complex, thereby increasing costs. In view of this, there is a need to propose a novel solution for solving the problems of the prior art.

BRIEF SUMMARY OF THE INVENTION

According to some embodiments, the invention provides a determination circuit, a memory device and its peripheral circuit. The proposed design can solve the problem of high power consumption, excessive turned-off leakage currents of page buffers, resistance mismatches, insufficient determination margins, and comparator errors, thereby minimizing the overall size and reducing the manufacturing cost.

The invention proposes a peripheral circuit of a memory device, and it includes a compensation circuit, a determination circuit, and a plurality of page buffers. The compensation circuit defines a leakage current. The determination circuit includes a current source, a first current mirror, a second current mirror, a potentially-qualified-bit quantity control unit, a determination circuit enable control unit, and a hysteresis circuit. The first current mirror is coupled to a first node and a control node. The current source outputs a reference current to a second node. The second current mirror is coupled to the current source and the first current mirror. The potentially-qualified-bit quantity control unit is coupled between the first node and a third node in parallel with the second current mirror. The determination circuit enable control unit is coupled to the second current mirror through the third node. The determination circuit enable control unit is configured to receive a determination circuit control signal, such that the third node is selectively pulled down to a ground voltage according to the determination circuit control signal. The hysteresis circuit has an input terminal coupled to the control node, and an output terminal coupled to a fourth node. The page buffers include an unselected page buffer and a selected page buffer. The unselected page buffer is coupled to the compensation circuit. The selected page buffer is coupled to the determination circuit.

In another preferred embodiment, the invention proposes a determination circuit that includes a current source, a first current mirror, a second current mirror, a potentially-qualified-bit quantity control unit, a determination circuit enable control unit, and a hysteresis circuit. The first current mirror is coupled to a first node and a control node. The current source outputs a reference current to a second node. The second current mirror is coupled to the current source and the first current mirror. The potentially-qualified-bit quantity control unit is coupled in parallel with the second current mirror between the first node and a third node. The determination circuit enable control unit is coupled to the second current mirror through the third node. The determination circuit enable control unit is configured to receive a determination circuit control signal, such that the third node is selectively pulled down to a ground voltage according to the determination circuit control signal. The hysteresis circuit has an input terminal coupled to the control node, and an output terminal coupled to a fourth node.

In another preferred embodiment, the invention proposes a memory device that includes the aforementioned peripheral circuit, a plurality of memory planes, a plurality of sensing circuits, and an error detection and correction circuit. The memory planes are coupled to the page buffers of the peripheral circuit. The sensing circuits are coupled to the page buffers of the peripheral circuit. The error detection and correction circuit is coupled to the sensing circuits.

According to the determination circuit proposed by the present invention, it is beneficial to save power and reduce the area, and is suitable for the application of low power consumption products. In addition, according to the peripheral circuit of the memory device proposed by the present invention, the accuracy of determination can be improved.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. Also, the term "couple" is intended to mean either an indirect or direct electrical connection. Accordingly, if one device is coupled to another device, that connection may be through a direct electrical connection, or through an indirect electrical connection via other devices and connections.

Figure 1:
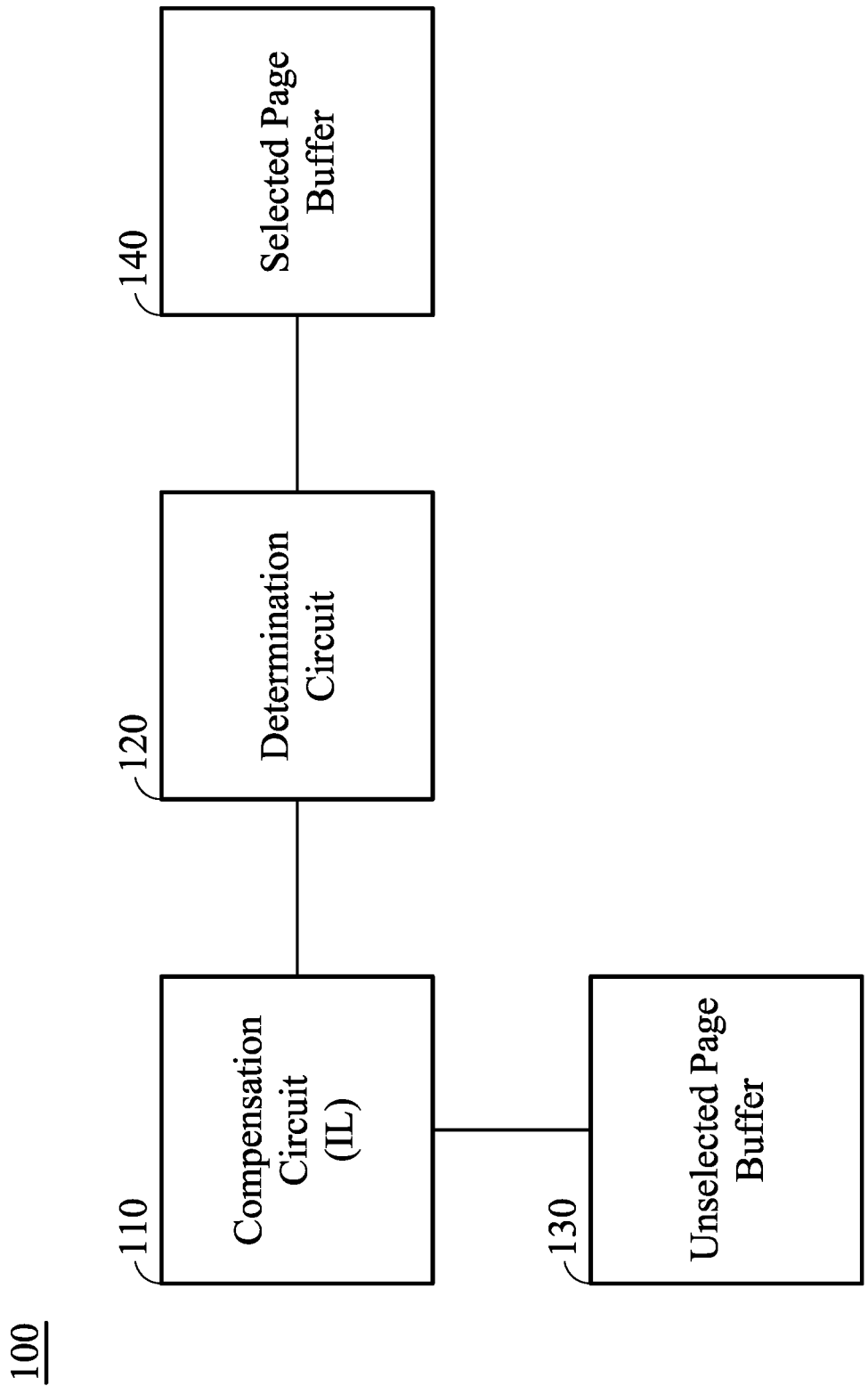
FIG. 1 is a diagram of a peripheral circuit of a memory device according to an embodiment of the invention.

As shown in FIG. 1, a peripheral circuit 100 of a memory device at least includes a compensation circuit 110, a determination circuit 120, and a plurality of page buffers according to an embodiment of the invention. For example, the memory device may be non-volatile memory, such as a NAND flash memory device or a NOR flash memory device, but it is not limited thereto. According to the operations (e.g., reading, writing, or erasing) performed on a specific address of the memory array of the memory device, these page buffers can be classified into an unselected page buffer 130 coupled to an unselected page and a selected page buffer 140 coupled to a selected page. The compensation circuit 110 defines a leakage current IL. The determination circuit 120 is coupled to the compensation circuit 110, and is operated according to the leakage current IL. The unselected page buffer 130 is coupled to the compensation circuit 110. The selected page buffer 140 is coupled to the determination circuit 120. It should be understood that the memory device may further include other components, such as a package structure, a memory array, an input and output circuit, an address register, a controller, a word line selecting and driving circuit, a column selection circuit, an ECC (Error Checking and Correction) circuit, and an internal voltage generation circuit, although they are not displayed in FIG. 1. The above-mentioned components can be designed according to known circuit structures, and they can transmit signals through a plurality of wires in known coupling relationship. For example, please refer to the description of U.S. Pat. No. 9,947,410 (but the invention is not limited thereto). The relative contents will not be illustrated herein over the disclosure.

Figure 2:
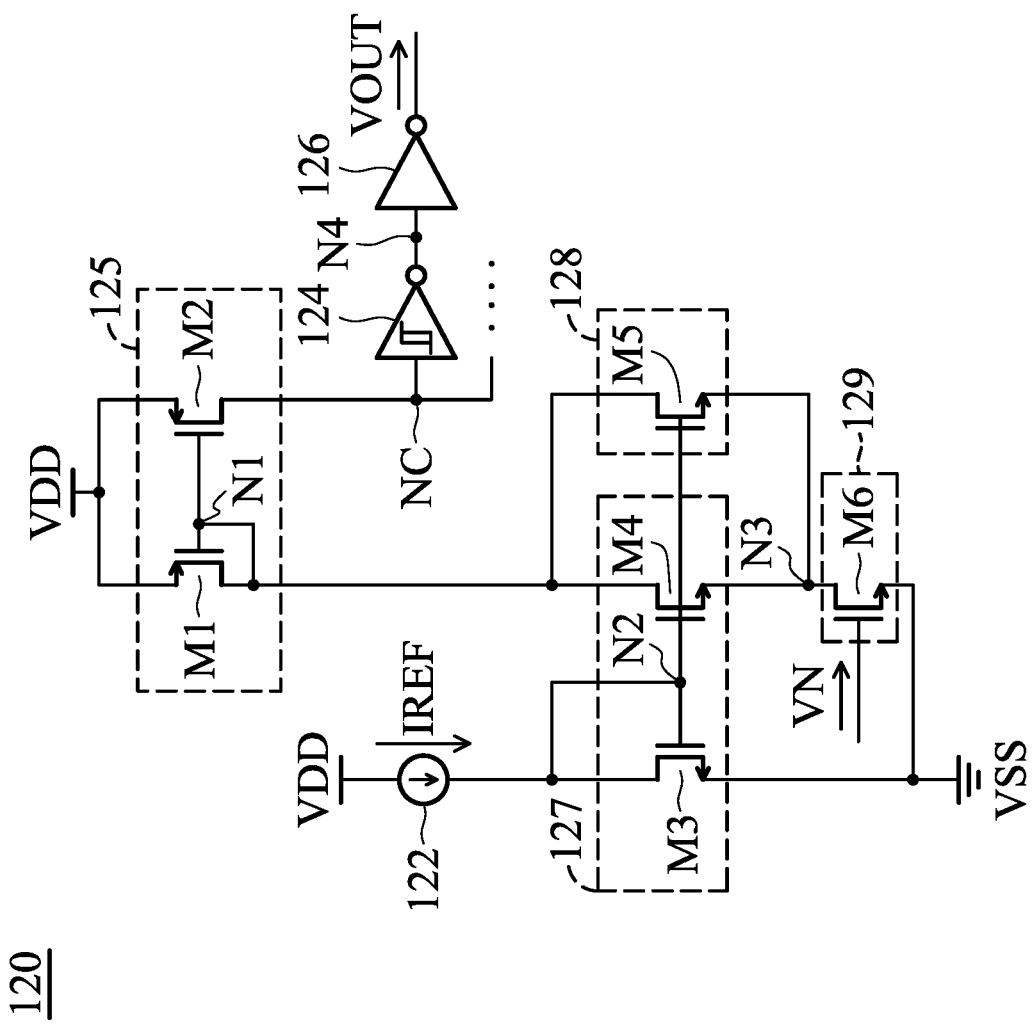
FIG. 2 is a diagram of a determination circuit according to an embodiment of the invention.

As shown in FIG. 2, the determination circuit 120 includes a current source 122, a hysteresis circuit 124, a first logic unit 126, a first current mirror 125, a second current mirror 127, a potentially-qualified-bit quantity control unit 128, and a determination circuit enable control unit 129 according to an embodiment of the invention. The first current mirror 125 is configured to replicate a reference current IREF. The first current mirror 125 includes a first transistor M1 and a second transistor M2. In an embodiment, each of the first transistor M1 and the second transistor M2 is a PMOS transistor (P-type Metal Oxide Semiconductor Field Effect Transistor or PMOSFET). The second current mirror 127 includes a third transistor M3 and a fourth transistor M4. The potentially-qualified-bit quantity control unit 128 includes a fifth transistor M5. The determination circuit enable control unit 129 includes a sixth transistor M6. In an embodiment, each of the third transistor M3, the fourth transistor M4, the fifth transistor M5, and the sixth transistor M6 is an NMOS transistor (N-type Metal Oxide Semiconductor Field Effect Transistor or NMOSFET). The first logic unit 126 may include an inverter.

In this embodiment, the first transistor M1 has a control terminal coupled to the first node N1, a first terminal coupled to a supply voltage VDD, and a second terminal coupled to the first node N1. The memory device of the embodiment can be applied to a low power-consumption product. For example, the supply voltage VDD may be lower than or equal to 1V. The second transistor M2 has a control terminal coupled to the first node N1, a first terminal coupled to the supply voltage VDD, and a second terminal coupled to a control node NC. In some embodiments, the size of the first transistor M1 is substantially the same as that of the second transistor M2. It should be noted that the so-called "transistor size" over the disclosure means the aspect ratio (W/L) of the corresponding transistor.

In this embodiment, the current source 122 outputs the reference current IREF to a second node N2. The third transistor M3 has a control terminal coupled to the second node N2, a first terminal coupled to a ground voltage VSS, and a second terminal coupled to the second node N2. For example, the ground voltage VSS may be defined as 0V. The fourth transistor M4 has a control terminal coupled to the second node N2, a first terminal coupled to a third node N3, and a second terminal coupled to the first node N1. In some embodiments, the size of the fourth transistor M4 is substantially 0.5 times the size of the third transistor M3. According to practical measurements, the above sizes can help to reduce the power consumption. The fifth transistor M5 has a control terminal coupled to the second node N2, a first terminal coupled to the third node N3, and a second terminal coupled to the first node N1. In some embodiments, the size of the fifth transistor M5 is N times the size of the third transistor M3, where "N" is a positive integer (e.g., 1, 2, 3 or 4). According to an embodiment of the invention, "N" is the maximum number of fail bits of the selected page buffer that are capable of being theoretically repaired by the ECC circuit of the memory device. In this embodiment, the second current mirror 127 is configured to replicate (N+0.5) times the reference current IREF.

For example, when the ECC circuit is configured to perform an ECC operation on a unit of data (e.g., 256-byte data), at most 2-bit errors can be repaired, and N can be set to 2. Thus, the determination circuit 120 allows at most 2-bit fail bits to be determined as potentially qualified. However, in another embodiment, the determination circuit 120 is used to check whether all of the bits are successfully programmed, that is, without implementing the judgment of potential qualification. Thus, the fifth transistor M5 is not actually required, or even if the fifth transistor M5 is provided, the operation of the fifth transistor M5 may be disabled. That is, the fifth transistor M5 is set according to the number N of fail bits determined as potentially qualified by the determination circuit 120, and the maximum value of N is equal to the theoretical maximum number of fail bits that the ECC circuit in the memory device can repair for the selected page buffer. In alternative embodiments, the fifth transistor M5 is replaced with N transistors coupled in parallel, and the size of each of the N transistors is substantially the same as the size of the third transistor M3. The sixth transistor M6 has a control terminal for receiving a determination circuit control signal VN, a first terminal coupled to the ground voltage VSS, and a second terminal coupled to the third node N3. In some embodiments, if the determination circuit control signal VN has a high logic level (e.g., a logic "1"), the determination circuit 120 will be enabled, and conversely, if the determination circuit control signal VN has a low logic level (e.g., a logic "0"), the determination circuit 120 will be disabled.

In this embodiment, the hysteresis circuit 124 has an input terminal coupled to the control node NC, and an output terminal coupled to a fourth node N4. In an embodiment, the hysteresis circuit 124 is implemented with a Smith trigger. For example, according to different first and second threshold voltages of the Smith trigger, the hysteresis circuit 124 can perform a hysteresis switching operation, so as to eliminate non-ideal output glitches of the determination circuit 120. The first logic unit 126 has an input terminal coupled to the fourth node N4, and an output terminal for outputting the output voltage VOUT. In some embodiments, if the output voltage VOUT has a high logic level, it will represent that all bits are processed and successfully programmed by the ECC circuit (i.e., the number of unqualified bits is smaller than or equal to N), so that a qualified or potentially-qualified result can be determined. Conversely, if the output voltage VOUT has a low logic level, it will represent the number of unqualified bits is greater than N, so that a programming failure result can be determined.

In an embodiment of performing a program operation, when the determination result of the determination circuit 120 is qualified or assumed to be qualified (e.g., the output voltage VOUT has a high logic level), the programming operation is completed, and the unqualified bits are directly stored in the selected page. When the determination result of the determination circuit 120 is not qualified or not assumed to be qualified (e.g., the output voltage VOUT has a low logic level), the controller checks whether the number of application times of the programming pulses reaches the predetermined maximum NMAX. If not, according to ISPP (Incremental Step Program Pulse), step program pulses will be generated, which are larger than the previous program pulses, and then the step program pulses will be applied to the selected page. When the number of application times of the programming pulses reaches the predetermined maximum NMAX, the program failure state is notified to the external controller, and the block including the selected page is marked as a bad block. In this case, the identification information of the bad block is stored in the spare area. Furthermore, when data is read including fail bits that are regarded as potentially qualified results, the ECC circuit detects the fail bits as errors, and corrects them to correct data. The work principle of the determination circuit of the invention will be described as follows.

Figure 3:
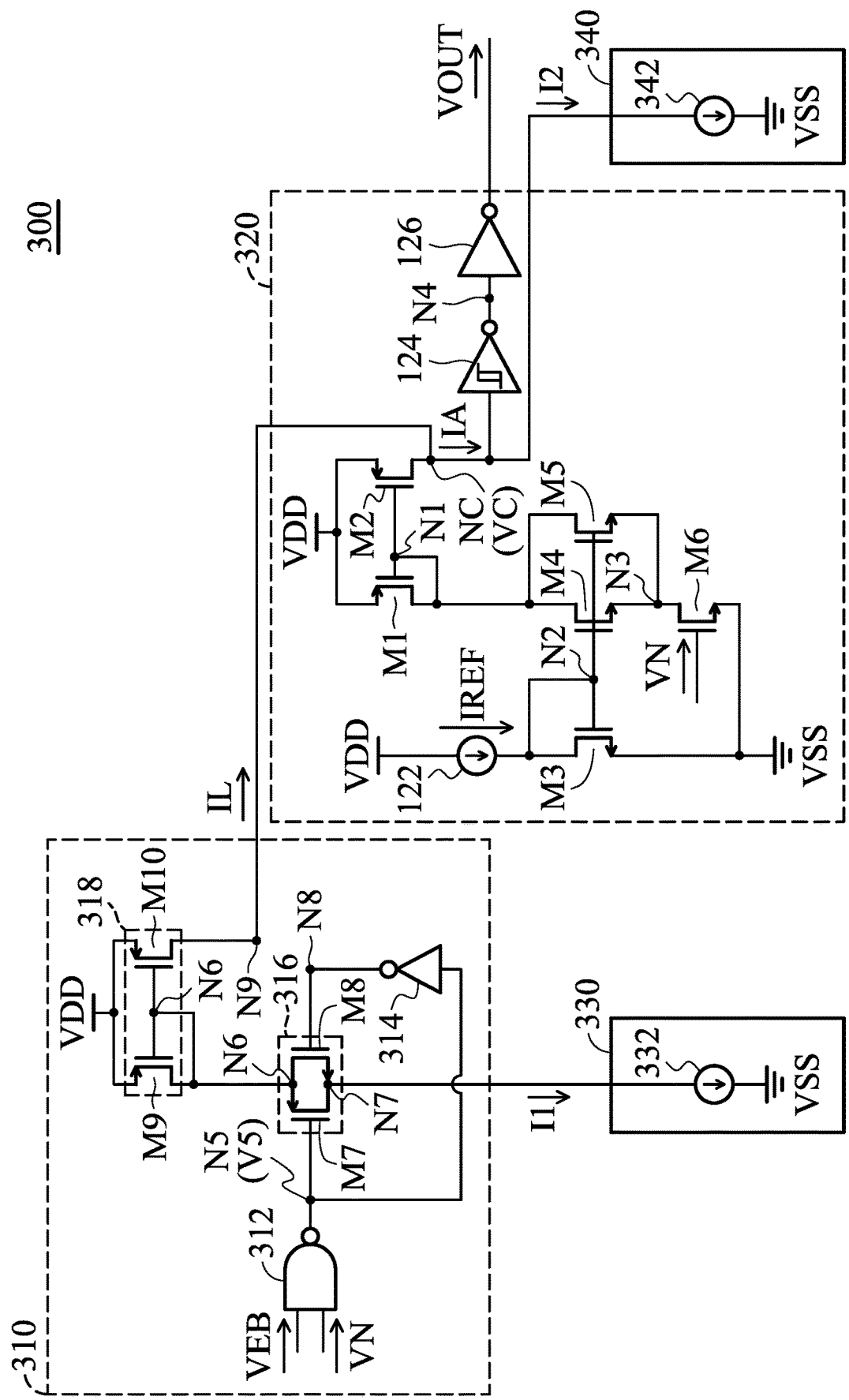
FIG. 3 is a diagram of a peripheral circuit of a memory device according to an embodiment of the invention.

FIG. 3 is a diagram of a peripheral circuit 300 of a memory device according to an embodiment of the invention. In this embodiment, the peripheral circuit 300 includes a compensation circuit 310, a determination circuit 320, an unselected page buffer 330, and a selected page buffer 340. The structural features of the determination circuit 320 have been described in the embodiment of FIG. 2. The compensation circuit 310 includes a NAND gate 312, a second logic unit 314, a transmission gate 316, and a third current mirror 318. The compensation circuit 310 is coupled to the unselected page buffer 330, so that the unselected page buffer 330 draws a first current I1 from the transmission gate 316. Furthermore, the compensation circuit 310 is coupled to the determination circuit 320, so as to output a leakage current IL to a control node NC of the determination circuit 320. The determination circuit 320 is coupled to the selected page buffer 340, so that the selected page buffer 340 draws a second current I2 through the control node NC. The second current I2 includes the leakage current of the selected page.

In some embodiments, the function of the compensation circuit 310 includes guiding the turned-off leakage current (Ioff leakage) of the elements in the unselected page buffer 330 to the determination circuit 320 through a current mirror. In addition, since the influence of the turned-off leakage current on the determination circuit 320 can be eliminated, the compensation circuit 310 is configured to improve the accuracy of determination.

The NAND gate 312 has a first input terminal for receiving an inverted plane selection enable signal VEB, a second input terminal for receiving the determination circuit control signal VN, and an output terminal coupled to the control terminal of the transmission gate 316 through a fifth node N5. The transmission gate 316 is coupled to the control terminal of the third current mirror 318 through a sixth node N6. The transmission gate 316 includes a seventh transistor M7 and an eighth transistor M8. The seventh transistor M7 has a control terminal coupled to the fifth node N5, a first terminal coupled to the sixth node N6, and a second terminal coupled to a seventh node N7. The eighth transistor M8 has a control terminal coupled to an eighth node N8, a first terminal coupled to the seventh node N7, and a second terminal coupled to the sixth node N6. The second logic unit 314 has an input terminal coupled to the fifth node N5, and an output terminal coupled to the eighth node N8. The third current mirror 318 includes a ninth transistor M9 and a tenth transistor M10. The ninth transistor M9 has a control terminal coupled to the sixth node N6, a first terminal coupled to the supply voltage VDD, and a second terminal coupled to the sixth node N6. The tenth transistor M10 has a control terminal coupled to the sixth node N6, a first terminal coupled to the supply voltage VDD, and a second terminal coupled to the determination circuit 320 through the ninth node N9. It should be noted that the compensation circuit 310 is configured to output the leakage current IL to the control node NC of the determination circuit 320 through the ninth node N9.

In some embodiments, the size of the ninth transistor M9 is substantially the same as that of the tenth transistor M10. Each of the seventh transistor M7, the ninth transistor M9, and the tenth transistor M10 may be a PMOSFET, and the eighth transistor M8 may be an NMOSFET.

The unselected page buffer 330 is configured to simulate a first current sink 332, which can draw the first current I1 from the seventh node N7 of the compensation circuit 310. Furthermore, the selected page buffer 340 is configured to simulate a second current sink 342, which can draw the second current I2 from the control node NC of the determination circuit 320. In some embodiments, the second node N2 and the third node N3 of the determination circuit 320 are respectively coupled to a plurality of transistors (not shown) in the selected page buffer 340. For example, if the operation on N selected page buffers regarded as failure, N times the reference current IREF may be drawn from the control node NC.

In some embodiments, the operational principles of the memory device 300 will be described as follows. When both the inverted plane selection enable signal VEB and the determination circuit control signal VN rise up to high logic levels, the voltage V5 at the fifth node N5 drops down to a low logic level for turning the transmission gate 316 on. By using the arrangement of the third current mirror 318, the leakage current IL may be substantially equal to the first current I1. A third current mirror may be formed by the third transistor M3, the fourth transistor M4, and the fifth transistor M5. It should be noted that the third current mirror may have different transistor sizes. In some embodiments, a control current IA flowing from the second transistor M2 to the control node NC is determined according to the following equation (1):

$$IA = IREF \cdot (0.5+N) + IL \qquad (1)$$

where "IA" represents the control current IA, "IREF" represents the reference current IREF, "N" represents a positive integer, and "IL" represents the leakage current IL.

At this time, the selected page buffer 340 draws the second current I2 from the control node NC. The control voltage VC at the control node NC is determined by both the control current IA and the second current I2. For example, if the control current IA is greater than the second current I2, the control voltage VC may be pulled up to a high logic level, and conversely, if the control current IA is smaller than the second current I2, the control voltage VC may be pulled down to a low logic level. In some embodiments, the second current I2 flowing from the control node NC to the selected page buffer 340 is determined according to the following equation (2):

$$I2 = IREF \cdot M \qquad (2)$$

where "I2" represents the second current I2, "IREF" represents the reference current IREF, and "M" represents 0 or a positive integer.

The aforementioned value M represents the number of unqualified bits in the selected page buffer 340. Assuming that the value N of the determination circuit 320 is set to 1, it can be considered that the determination circuit 320 allows a maximum of 1 bit of unqualified bits to be determined as potentially qualified. If the selected page buffer 340 has 0 or 1 unqualified bit, the control current IA will still be greater than the second current I2, so that the control voltage VC can be maintained at a high logic level. Otherwise, if the selected page buffer 340 has 2 or more unqualified bits, the control current IA will be smaller than the second current I2, and the control voltage VC will drop down to a low logic level. By analyzing the output voltage VOUT of the determination circuit 320, the error correction test result can be easily read out.

Figure 4:
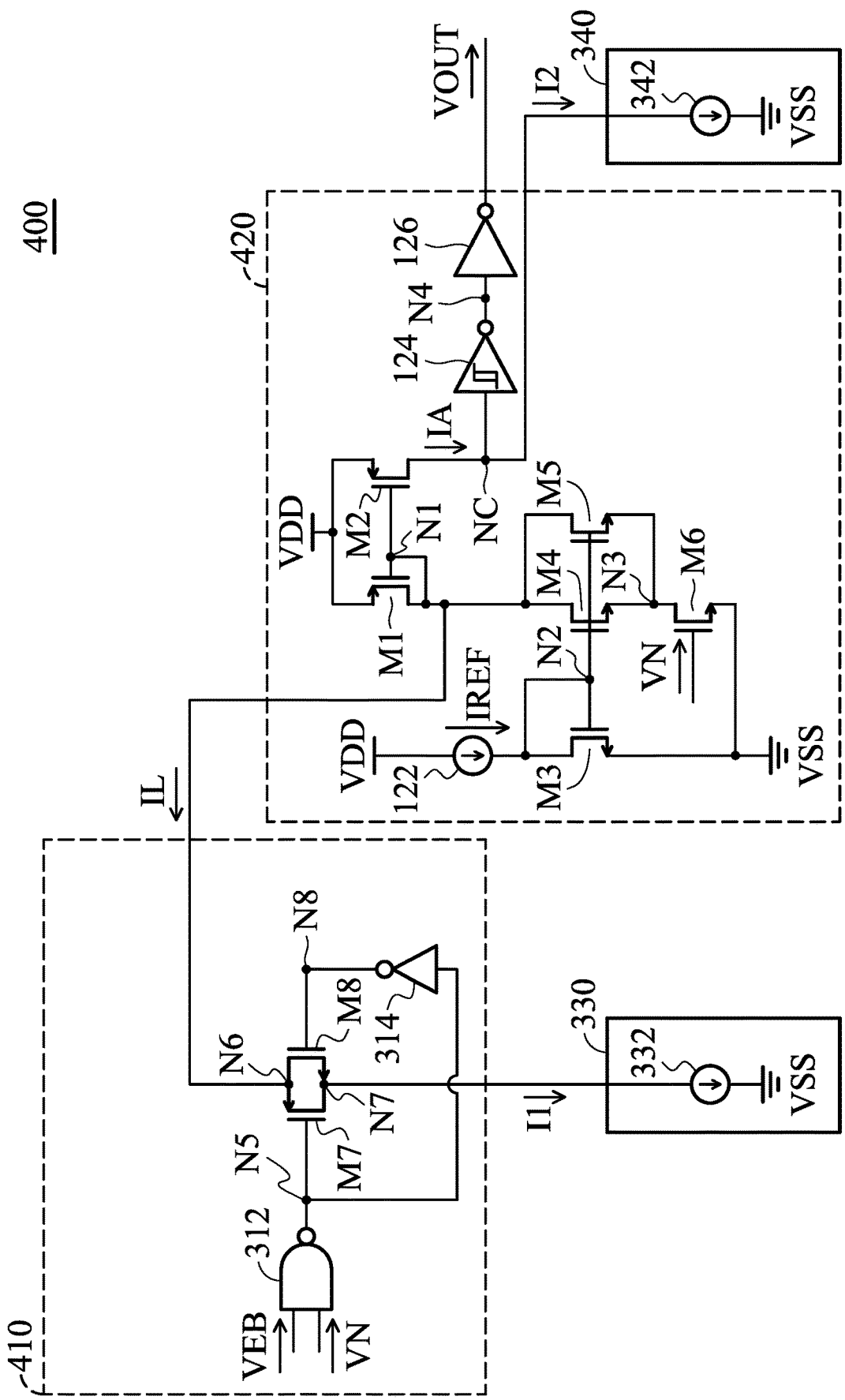
FIG. 4 is a diagram of a peripheral circuit of a memory device according to an embodiment of the invention.

FIG. 4 is a diagram of a peripheral circuit 400 of a memory device according to an embodiment of the invention. FIG. 4 is similar to FIG. 3. The structural features of a determination circuit 420 of the peripheral circuit 400 have been described in the embodiment of FIG. 2. However, in the embodiment of FIG. 4, a compensation circuit 410 of the peripheral circuit 400 does not include the aforementioned third current mirror 318. It should be noted that in this embodiment, the sixth node N6 of the compensation circuit 410 is configured to draw the leakage current IL from the first node N1 of the determination circuit 420. Although the third current mirror 318 is omitted, the above equations (1) and (2) can be applied to the peripheral circuit 400. According to practical measurements, the peripheral circuit 400 of FIG. 4 has relatively small design area, and the matching of the first current mirror 125 is further improved. Other features of the peripheral circuit 400 are similar to those of the peripheral circuit 300 of FIG. 3. Therefore, the two embodiments can achieve similar levels of performance.

Figure 5:
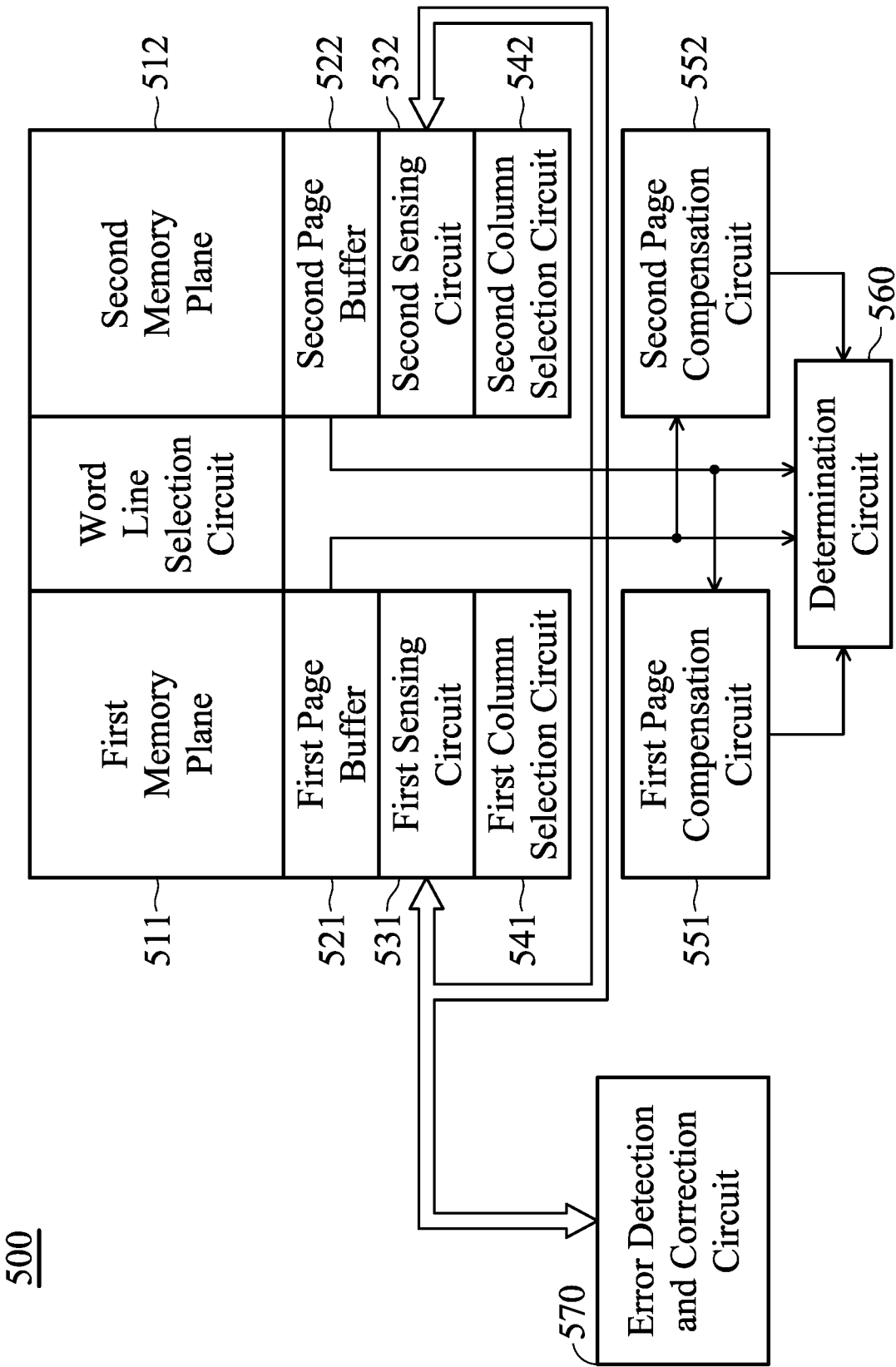
FIG. 5 is a diagram of a memory device according to an embodiment of the invention.

FIG. 5 is a diagram of a memory device 500 according to an embodiment of the invention. In the embodiment of FIG. 5, the memory device 500 includes a first memory plane 511, a second memory plane 512, a first sensing circuit 531, a second sensing circuit 532, an error detection and correction circuit 570, and a peripheral circuit. The peripheral circuit includes a first page buffer 521, a second page buffer 522, a first column selection circuit 541, a second column selection circuit 542, a first page compensation circuit 551, a second page compensation circuit 552, and a determination circuit 560. The first memory plane 511 and the second memory plane 512 are coupled to the first page buffer 521 and the second page buffer 522, respectively. The first page buffer 521 and the second page buffer 522 are coupled to the first sensing circuit 531 and the second sensing circuit 532, respectively. The error detection and correction circuit 570 is coupled to the first sensing circuit 531 and the second sensing circuit 532. In this embodiment, if the first memory plane 511 is a selected page and the second memory plane 512 is an unselected page, the first page compensation circuit 551 will be coupled to the second page buffer 522. Similarly, if the second memory plane 512 is a selected page and the first memory plane 511 is an unselected page, the second page compensation circuit 552 will be coupled to the first page buffer 521. It should be noted that any peripheral circuit and any determination circuit in the embodiments of FIGS. 1 to 4 may be applied to the memory device 500 of FIG. 5.

The invention provides a novel peripheral circuit and a novel determination circuit of a memory device, according to the invention, a current comparison mechanism (e.g., comparing the control current IA with the second current I2) is used to replace the conventional voltage comparator. Therefore, the invention can avoid the problems of resistance mismatch and comparator errors. Additionally, in comparison to the conventional design, the invention can use a lower supply voltage and provide a larger determination margin.

Note that the above parameters are not limitations of the invention. A designer can adjust these setting values according to different requirements. The memory device and the determination circuit of the invention are not limited to the configurations of FIGS. 1-5. The invention may merely include any one or more features of any one or more embodiments of FIGS. 1-5. In other words, not all of the features displayed in the figures should be implemented in the memory device and the determination circuit of the invention. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:
1. A peripheral circuit of a memory device, comprising:
  a compensation circuit, configured to define a leakage current;
  a determination circuit, coupled to the compensation circuit, wherein the determination circuit comprises:
    a first current mirror, coupled to a first node and a control node;
    a current source, outputting a reference current to a second node;

a second current mirror, coupled to the current source and the first current mirror;
a potentially-qualified-bit quantity control unit, coupled between the first node and a third node in parallel with the second current mirror;
a determination circuit enable control unit, coupled to the second current mirror through the third node, wherein the determination circuit enable control unit is configured to receive a determination circuit control signal, such that the third node is selectively pulled down to a ground voltage according to the determination circuit control signal; and
a hysteresis circuit, wherein the hysteresis circuit has an input terminal coupled to the control node, and an output terminal coupled to a fourth node; and
a plurality of page buffers, comprising an unselected page buffer and a selected page buffer, wherein the unselected page buffer is coupled to the compensation circuit, and the selected page buffer is coupled to the determination circuit.

2. The peripheral circuit of the memory device as claimed in claim 1, wherein the determination circuit further comprises a first logic unit, and wherein the first logic unit has an input terminal coupled to the fourth node, and an output terminal for outputting an output voltage.

3. The peripheral circuit of the memory device as claimed in claim 1, wherein the first current mirror comprises:
a first transistor, wherein the first transistor has a control terminal coupled to the first node, a first terminal coupled to a supply voltage, and a second terminal coupled to the first node; and
a second transistor, wherein the second transistor has a control terminal coupled to the first node, a first terminal coupled to the supply voltage, and a second terminal coupled to the control node;
wherein the second current mirror comprises:
a third transistor, wherein the third transistor has a control terminal coupled to the second node, a first terminal coupled to the ground voltage, and a second terminal coupled to the second node; and
a fourth transistor, wherein the fourth transistor has a control terminal coupled to the second node, a first terminal coupled to the third node, and a second terminal coupled to the first node;
wherein the potentially-qualified-bit quantity control unit comprises:
a fifth transistor, wherein the fifth transistor has a control terminal coupled to the second node, a first terminal coupled to the third node, and a second terminal coupled to the first node;
wherein the determination circuit enable control unit comprises:
a sixth transistor, wherein the sixth transistor has a control terminal for receiving the determination circuit control signal, a first terminal coupled to the ground voltage, and a second terminal coupled to the third node.

4. The peripheral circuit of the memory device as claimed in claim 3, wherein each of the first transistor and the second transistor is a PMOS transistor (P-type Metal Oxide Semiconductor Field Effect Transistor), and wherein each of the third transistor, the fourth transistor, the fifth transistor, and the sixth transistor is an NMOS transistor (N-type Metal Oxide Semiconductor Field Effect Transistor).

5. The peripheral circuit of the memory device as claimed in claim 3, wherein a size of the fourth transistor is 0.5 times that of the third transistor.

6. The peripheral circuit of the memory device as claimed in claim 3, wherein a size of the fifth transistor is N times that of the third transistor, and N is a maximum number of fail bits that are capable of being repaired by an error detection and correction circuit of the memory device.

7. The peripheral circuit of the memory device as claimed in claim 1, wherein the compensation circuit comprises:
a NAND gate, configured to receive an inverted plane selection enable signal and the determination circuit control signal, and to provide a computation result for a fifth node;
a second logic unit, wherein the second logic unit has an input terminal coupled to the fifth node, and an output terminal coupled to an eighth node; and
a transmission gate, coupled between the fifth node and the eighth node, wherein the transmission gate is configured to provide a first current for the unselected page buffer, and to receive the leakage current from the first node of the determination circuit.

8. The peripheral circuit of the memory device as claimed in claim 7, wherein the transmission gate comprises:
a seventh transistor, wherein the seventh transistor has a control terminal coupled to the fifth node, a first terminal coupled to a sixth node, and a second terminal coupled to a seventh node; and
an eighth transistor, wherein the eighth transistor has a control terminal coupled to the eighth node, a first terminal coupled to the seventh node, and a second terminal coupled to the sixth node;
wherein the seventh transistor is a PMOS transistor, and the eighth transistor is an NMOS transistor.

9. The peripheral circuit of the memory device as claimed in claim 1, wherein the compensation circuit comprises:
a NAND gate, configured to receive an inverted plane selection enable signal and the determination circuit control signal, and to provide a computation result for a fifth node;
a second logic unit, wherein the second logic unit has an input terminal coupled to the fifth node, and an output terminal coupled to an eighth node;
a third current mirror, coupled to a sixth node and the determination circuit; and
a transmission gate, coupled between the fifth node and the eighth node, wherein the transmission gate is configured to provide a first current for the unselected page buffer, and to provide the leakage current for the control node of the determination circuit through a ninth node.

10. The peripheral circuit of the memory device as claimed in claim 9, wherein the unselected page buffer draws the first current from the seventh node of the compensation circuit, and the selected page buffer draws a second current from the control node of the determination circuit;
wherein the third current mirror comprises:
a ninth transistor, wherein the ninth transistor has a control terminal coupled to the sixth node, a first terminal coupled to the supply voltage, and a second terminal coupled to the sixth node; and
a tenth transistor, wherein the tenth transistor has a control terminal coupled to the sixth node, a first terminal coupled to the supply voltage, and a second terminal coupled to the ninth node.

11. A determination circuit, comprising:
a first current mirror, coupled to a first node and a control node;
a current source, outputting a reference current to a second node;

a second current mirror, coupled to the current source and the first current mirror;

a potentially-qualified-bit quantity control unit, coupled in parallel with the second current mirror between the first node and a third node;

a determination circuit enable control unit, coupled to the second current mirror through the third node, wherein the determination circuit enable control unit is configured to receive a determination circuit control signal, such that the third node is selectively pulled down to a ground voltage according to the determination circuit control signal; and a hysteresis circuit, wherein the hysteresis circuit has an input terminal coupled to the control node, and an output terminal coupled to a fourth node.

12. The determination circuit as claimed in claim 11, further comprising a first logic unit, wherein the first logic unit has an input terminal coupled to the fourth node, and an output terminal for outputting an output voltage.

13. The determination circuit as claimed in claim 11, wherein the first current mirror comprises:

a first transistor, wherein the first transistor has a control terminal coupled to the first node, a first terminal coupled to a supply voltage, and a second terminal coupled to the first node; and a second transistor, wherein the second transistor has a control terminal coupled to the first node, a first terminal coupled to the supply voltage, and a second terminal coupled to the control node;

wherein the second current mirror comprises:

a third transistor, wherein the third transistor has a control terminal coupled to the second node, a first terminal coupled to the ground voltage, and a second terminal coupled to the second node; and a fourth transistor, wherein the fourth transistor has a control terminal coupled to the second node, a first terminal coupled to the third node, and a second terminal coupled to the first node;

wherein the potentially-qualified-bit quantity control unit comprises:

a fifth transistor, wherein the fifth transistor has a control terminal coupled to the second node, a first terminal coupled to the third node, and a second terminal coupled to the first node;

wherein the determination circuit enable control unit comprises:

a sixth transistor, wherein the sixth transistor has a control terminal for receiving the determination circuit control signal, a first terminal coupled to the ground voltage, and a second terminal coupled to the third node.

14. The determination circuit as claimed in claim 13, wherein each of the first transistor and the second transistor is a PMOS transistor (P-type Metal Oxide Semiconductor Field Effect Transistor), and wherein each of the third transistor, the fourth transistor, the fifth transistor, and the sixth transistor is an NMOS transistor (N-type Metal Oxide Semiconductor Field Effect Transistor).

15. The determination circuit as claimed in claim 13, wherein a size of the fourth transistor is 0.5 times that of the third transistor.

16. The determination circuit as claimed in claim 13, wherein a size of the fifth transistor is N times that of the third transistor, and N is a maximum number of fail bits that are capable of being repaired by an error detection and correction circuit of a memory device.

17. A memory device, comprising:

the peripheral circuit as claimed in claim 1;

a plurality of memory planes, coupled to the page buffers of the peripheral circuit;

a plurality of sensing circuits, coupled to the page buffers of the peripheral circuit; and an error detection and correction circuit, coupled to the sensing circuits.

18. The memory device as claimed in claim 17, wherein any of the memory planes is a NAND flash memory array or a NOR flash memory array.

19. The memory device as claimed in claim 17, wherein the first current mirror comprises:

a first transistor, wherein the first transistor has a control terminal coupled to the first node, a first terminal coupled to a supply voltage, and a second terminal coupled to the first node; and a second transistor, wherein the second transistor has a control terminal coupled to the first node, a first terminal coupled to the supply voltage, and a second terminal coupled to the control node;

wherein the second current mirror comprises:

a third transistor, wherein the third transistor has a control terminal coupled to the second node, a first terminal coupled to the ground voltage, and a second terminal coupled to the second node; and a fourth transistor, wherein the fourth transistor has a control terminal coupled to the second node, a first terminal coupled to the third node, and a second terminal coupled to the first node;

wherein the potentially-qualified-bit quantity control unit comprises:

a fifth transistor, wherein the fifth transistor has a control terminal coupled to the second node, a first terminal coupled to the third node, and a second terminal coupled to the first node;

wherein the determination circuit enable control unit comprises:

a sixth transistor, wherein the sixth transistor has a control terminal for receiving the determination circuit control signal, a first terminal coupled to the ground voltage, and a second terminal coupled to the third node.

20. The memory device as claimed in claim 17, wherein the compensation circuit comprises:

a NAND gate, configured to receive an inverted plane selection enable signal and the determination circuit control signal, and to provide a computation result for a fifth node;

a second logic unit, wherein the second logic unit has an input terminal coupled to the fifth node, and an output terminal coupled to an eighth node; and a transmission gate, coupled between the fifth node and the eighth node, wherein the transmission gate is configured to provide a first current for the unselected page buffer, and to receive the leakage current from the first node of the determination circuit.

* * * * *